United States Patent
Zheng et al.

(10) Patent No.: US 11,863,033 B2
(45) Date of Patent: Jan. 2, 2024

(54) DISPLACEMENT DETECTION CIRCUIT OF MAGLEV ROTOR SYSTEM AND DISPLACEMENT SELF-SENSING SYSTEM THEREOF

(71) Applicants: Ningbo Institute of Technology, Beihang University, Ningbo (CN); Beihang University, Beijing (CN)

(72) Inventors: Shiqiang Zheng, Beijing (CN); Shitong Wei, Beijing (CN); Tong Wen, Beijing (CN); Kun Wang, Beijing (CN); Yun Le, Beijing (CN); Kun Mao, Beijing (CN); Di Wang, Beijing (CN)

(73) Assignees: Ningbo Institute of Technology, Beihang University, Ningbo (CN); Beihang University, Beijing (CN)

( * ) Notice: Subject to any disclaimer, the term of this patent is extended or adjusted under 35 U.S.C. 154(b) by 0 days.

(21) Appl. No.: 17/995,953

(22) PCT Filed: Jul. 27, 2020

(86) PCT No.: PCT/CN2020/104867
§ 371 (c)(1),
(2) Date: Oct. 11, 2022

(87) PCT Pub. No.: WO2021/203585
PCT Pub. Date: Oct. 14, 2021

(65) Prior Publication Data
US 2023/0117718 A1   Apr. 20, 2023

(30) Foreign Application Priority Data
Apr. 10, 2020 (CN) .......................... 202010281385.9

(51) Int. Cl.
*H02K 29/08* (2006.01)
*H02K 11/215* (2016.01)
(Continued)

(52) U.S. Cl.
CPC ............... *H02K 29/08* (2013.01); *G01B 7/02* (2013.01); *G01D 5/145* (2013.01); *G01R 33/07* (2013.01);
(Continued)

(58) Field of Classification Search
CPC .. H02K 11/215; H02K 29/08; H02K 2213/03; G01B 7/02; G01D 5/145; G01R 33/07
See application file for complete search history.

(56) References Cited

U.S. PATENT DOCUMENTS

2008/0143323 A1   6/2008   Akahane

FOREIGN PATENT DOCUMENTS

| CN | 101876556 A | 11/2010 |
|---|---|---|
| CN | 101931371 A | 12/2010 |

(Continued)

OTHER PUBLICATIONS

Wang, Xiaoguang et al., "Study on Radial Measuring Method of Axial Displacement of Magnetic Suspension Rotor" China Sciencepaper, vol. 12, No. 16, Aug. 31, 2007, ISSN: 2095-2783, pp. 1805-1809.
(Continued)

*Primary Examiner* — Mohamad A Musleh
(74) *Attorney, Agent, or Firm* — Jaffery Watson Mendonsa & Hamilton LLP

(57) ABSTRACT

The present disclosure provides a displacement detection circuit of a maglev rotor system and a displacement self-sensing system thereof. The displacement detection circuit comprises a current sampling circuit (10) configured to collect a current flowing through a corresponding coil (4); coils (4), which are coils (4) distributed in series in the maglev rotor system; Hall sensors (20), the Hall sensors (20) being arranged in an upper auxiliary air gap (8) and a lower auxiliary air gap (8) of the maglev rotor system, and sensing surfaces of the Hall sensors (20) being perpendicular to
(Continued)

magnetic field directions in the corresponding auxiliary air gaps (8); a Hall signal processing circuit (30) connected to the Hall sensors (20) and configured to differentiate a Hall sensing signal corresponding to the upper auxiliary air gap (8) and a Hall sensing signal corresponding to the lower auxiliary air gap (8); and a displacement signal resolving circuit (40) connected to the current sampling circuit (10) and the Hall signal processing circuit (30) respectively and configured to acquire a displacement of a rotor in the maglev rotor system according to the current and a differentiation result. By using the detection circuit and the displacement self-sensing system thereof, the axial size of the rotor is reduced, such that detection and control are coplanar, and high precision and simple design are realized.

10 Claims, 7 Drawing Sheets

(51) Int. Cl.
    *G01B 7/02*     (2006.01)
    *G01D 5/14*     (2006.01)
    *G01R 33/07*     (2006.01)

(52) U.S. Cl.
    CPC ....... *H02K 11/215* (2016.01); *H02K 2213/03* (2013.01)

(56) References Cited

FOREIGN PATENT DOCUMENTS

| | | | |
|---|---|---|---|
| CN | 102075131 A | 5/2011 | |
| CN | 102175131 | 9/2011 | |
| CN | 102368657 A | 3/2012 | |
| CN | 102545744 A | 7/2012 | |
| CN | 103174746 | 6/2013 | |
| CN | 104380582 A | 2/2015 | |
| CN | 204179919 U | 2/2015 | |
| CN | 104795958 | 7/2015 | |
| CN | 204993133 | 1/2016 | |
| CN | 101802415 A | 8/2018 | |
| CN | 108646571 | 10/2018 | |
| CN | 108646571 A * | 10/2018 | ........... G05B 13/042 |
| CN | 109067280 | 12/2018 | |
| CN | 109780985 A | 5/2019 | |
| CN | 110231133 A | 9/2019 | |
| CN | 110518724 A | 11/2019 | |
| JP | H0775303 A * | 3/1995 | |
| KR | 20150145407 A * | 12/2015 | |
| KR | 20160036210 | 4/2016 | |
| KR | 20170127648 | 11/2017 | |

OTHER PUBLICATIONS

China National Intellectual Property Administration (ISA/CN), International Search Report for PCT/CN2020/104867, dated Jan. 6, 2021, 3 pages.

China National Intellectual Property Administration (ISA/CN), Written Opinion of the International Searching Authority for PCT/CN2020/104867, dated Jan. 6, 2021, 6 pages.

Song, Xinda et al., "A Novel Sensorless Rotor Position Detection Method for High-Speed Surface PM Motors in a Wide Speed Range", IEEE Transactions on Power Electronics, Sep. 2017, 12 pages.

Wang, Kun et al., "Analysis and Experiment of Self-Differential Eddy-Current Sensor for High-Speed Magnetic Suspension Electric Machine", IEEE Transactions on Industry Applications, vol. 55, No. 3, May/Jun. 2019, pp. 2538-2547.

Wang, Kun et al., "Analysis and Experimental Study of a Novel Self-Differential Eddy Current Sensor for High-Speed Magnetic Electrical Machine", IEEE Xplore, 2017, 6 pages.

Pesch, Alexander H. et al., "Condition Monitoring of Active Magnetic Bearings on the Internet of Things", Actuators 2019, www.mdpi.com/journal/actuators, 13 pages.

Sun, Maolin et al., "Disturbance Force Self-Sensing and Suppression Method for AMB-Rotor System Based on Disturbance Observer", IEEE Sensors Journal, vol. 20, No. 16, Aug. 15, 2020, pp. 9245-9252.

Mystkowski, Arkadiusz et al., "Flux measurement and conditioning system for heteropolar active magnetic bearing using Kapton-foil Hall sensors", Mechanical Systems and Processing, 2019, pp. 394-404.

Bangcheng, Han, et al., "Loss estimation, thermal analysis, and measurement of a large-scale turbomolecular bump with active magnetic bearings", The Institution of Engineering and Technology, IET Electr. Power Appl., 2020, vol. 14 Iss 7, pp. 1283-1290.

Li, Jinlei, et al., "Synchronous Vibration Suppression of Magnetically Suspended Rotor System Using Improved Adaptive Frequency Estimation", IEEE Sensor Journal, vol. 20, No. 19, Oct. 1, 2020, pp. 11212-11220.

Feng, et al. "Design and Implementation of Magnetic Suspended Control Moment Gyroscope High-Speed Rotor Driving System," China Excellent Master's Dissertation Full-text Database Engineering Science and Technology Series II, Mar. 15, 2016, all pages.

Zhang, et al. "Design and experimental study of a novel self-inductance displacement sensor for active magnetic bearings," Journal of Instrumentation, Jan. 31, 2018, pp. 100-109, vol. 39, No. 1.

* cited by examiner

DISPLACEMENT DETECTION CIRCUIT OF MAGLEV ROTOR SYSTEM AND DISPLACEMENT SELF-SENSING SYSTEM THEREOF

CROSS-REFERENCE TO RELATED APPLICATIONS

This application is a national phase application of International Application No. PCT/CN2020/104867, filed on Jul. 27, 2020, which claims the priority to the Chinese patent application No. 202010281385.9, entitled "DISPLACEMENT DETECTION CIRCUIT OF MAGLEV ROTOR SYSTEM AND DISPLACEMENT SELF-SENSING SYSTEM THEREOF," filed on Apr. 10, 2020, to the China National Intellectual Property Administration, the entire contents of each of which are incorporated herein by reference.

TECHNICAL FIELD

The present disclosure relates to the technical field of maglev bearings, and more particularly to a displacement detection circuit of a maglev rotor system and a displacement self-sensing system thereof.

BACKGROUND

A maglev bearing has the characteristics of non-contact friction, high rotating speed, no lubrication and the like, and a maglev rotor system itself may realize active vibration control without additional hardware equipment, such that the maglev rotor system has been widely used in earth observation satellite, space telescope, and other aspects. To realize the high-precision control of a maglev rotor, it is necessary to accurately obtain a position of the rotor relative to a stator in the maglev bearing.

With the development of various high-resolution satellites, higher requirements are put forward for the stability and vibration of a maglev control system. Due to the non-contact characteristic of the maglev system, it is necessary to use a non-contact sensor to determine a displacement of the rotor relative to the stator in the maglev rotor system. A traditional displacement sensor needs to select a detection surface separately, which not only increases an axial size of the rotor, but also makes the detection and control of the displacement non-coplanar, thus resulting in an error in the detection of the displacement. Moreover, the traditional displacement sensor has a high cost and poor reliability. In addition, a traditional displacement self-sensing magnetic bearing estimates the position of the rotor only by extracting a component in a current ripple. In order to ensure an estimation precision of the component, it is necessary to design a complex extracting circuit, such that a traditional displacement detection method limits the improvement of the vibration performance of the maglev system.

SUMMARY

The technical problem to be solved by the present disclosure is that the existing displacement sensor needs to select a detection surface separately, which increases an axial size of a rotor, and makes the detection and control of a displacement non-coplanar, thus resulting in an error in the detection of the displacement.

In order to solve the technical problem above, an embodiment of the present disclosure provides a displacement detection circuit of a maglev rotor system, which comprises:

a current sampling circuit configured to collect a current flowing through corresponding coils, wherein the coils comprise coils distributed in series in the maglev rotor system;

Hall sensors, wherein the Hall sensors are arranged in an upper auxiliary air gap, and a lower auxiliary air gap of the maglev rotor system, and sensing surfaces of the Hall sensors are perpendicular to magnetic field directions in the corresponding auxiliary air gaps;

a Hall signal processing circuit connected to the Hall sensors and configured to perform differential processing on a Hall sensing signal corresponding to the upper auxiliary air gap and a Hall sensing signal corresponding to the lower auxiliary air gap; and a displacement signal resolving circuit connected to the current sampling circuit and the Hall signal processing circuit, respectively and configured to acquire a displacement of a rotor in the maglev rotor system according to the current and a result of the differential processing.

Optionally, the current sampling circuit comprises:

a first amplifying circuit, wherein the first amplifying circuit is configured to amplify the current flowing through a sampling resistor.

Optionally, an amplification factor of the first amplifying circuit satisfies the following formula:

$$a=2\mu_0 N(4A_2 h_1 + 2A_1 h_2),$$

wherein a is the amplification factor of the first amplifying circuit, wherein to is the permeability of vacuum, and wherein N is the number of turns of one of the coils, and when the rotor in the maglev rotor system is located in a balanced position, a primary air gap has a width of $h_1$ and a surface area of $A_1$, and the auxiliary air gap has a width of $h_2$ and a surface area of $A_2$.

Optionally, the Hall signal processing circuit comprises:

two amplifying branches and a differential circuit, wherein the amplifying branches are connected to the corresponding Hall sensors; and each of the amplifying branches comprises a second amplifying circuit, the second amplifying circuits in the amplifying branches are connected to the corresponding Hall sensing signals of the corresponding auxiliary air gaps, and the output ends of the second amplifying circuits in the two amplifying branches are both connected to the differential circuit.

Optionally, the displacement signal resolving circuit comprises:

a division circuit and a square rooting circuit, the division circuit is connected to the square rooting circuit, the division circuit is configured to divide an output signal of the current sampling circuit and an output signal of the Hall signal processing circuit, and the square rooting circuit is configured to perform offset adjustment and square rooting functions on an output signal of the division circuit.

Optionally, the square rooting circuit comprises:

an offset adjustment circuit and a square-rooting circuit, wherein the offset adjustment circuit is connected to the square-rooting circuit, wherein the offset adjustment circuit is configured to superimpose an offset adjustment value on the output signal of the division circuit according to a reference signal, and wherein the square-rooting circuit is configured to perform square rooting functions on an output signal of the offset adjustment circuit.

Optionally, the offset adjustment value corresponding to the offset adjustment circuit satisfies the following formula:

$$b=(2A_2h_1+A_1h_2)^2,$$

wherein b is the offset adjustment value corresponding to the offset adjustment circuit, and when the rotor in the maglev rotor system is located in a balanced position, a primary air gap has a width of $h_1$ and a surface area of $A_1$, and the auxiliary air gap has a width of $h_2$ and a surface area of $A_2$.

Optionally, amplification factor control resistors in the current sampling circuit and the Hall signal processing circuit, an amplification factor control resistor in the offset adjustment circuit, and an introduction resistor of the reference signal are all sliding rheostats.

Optionally, a width of a primary air gap corresponding to the displacement of the rotor satisfies the following calculation formula:

$$h = \frac{1}{2A_2}\sqrt{(2A_2h_1 + A_1h_2)^2 - \frac{2\mu_0 NI(4A_2h_1 + 2A_1h_2)}{B_1 - B_2}},$$

wherein h is the width of the primary air gap corresponding to the displacement of the rotor, the displacement of the rotor in the maglev rotor system is equal to a sum of a position of the stator in the maglev rotor system and the width of the primary air gap corresponding to the displacement of the rotor, $\mu_0$ is a permeability of vacuum, N is a number of turns of one of the coils, and I is the current, and when the rotor in the maglev rotor system is located in a balanced position, the primary air gap has a width of $h_1$ and a surface area of $A_1$, the auxiliary air gap has a width of $h_2$ and a surface area of $A_2$, $B_1$ is the Hall sensing signal corresponding to the upper auxiliary air gap, and $B_2$ is the Hall sensing signal corresponding to the lower auxiliary air gap.

In a second aspect, an embodiment of the present disclosure further provides a maglev rotor displacement self-sensing system, which comprises a maglev rotor system and the displacement detection circuit of the maglev rotor system in a first aspect, wherein the maglev rotor system is connected to the displacement detection circuit, and the maglev rotor system comprises a permanent magnet offset maglev rotor system with an auxiliary air gap.

Compared with the prior art, the technical solutions provided by the embodiments of the present disclosure have the following advantages.

The displacement detection circuit provided by the embodiment of the present disclosure comprises the current sampling circuit, the Hall sensors, the Hall signal processing circuit and the displacement signal resolving circuit, wherein the current sampling circuit is configured to collect the current flowing through the corresponding coil, and the coil comprises the coils distributed in series in the maglev rotor system; the Hall sensors are arranged in the upper auxiliary air gap and the lower auxiliary air gap of the maglev rotor system, and the sensing surfaces of the Hall sensors are perpendicular to the magnetic field directions in the corresponding auxiliary air gaps; the Hall signal processing circuit is configured to perform differential processing on the Hall sensing signal corresponding to the upper auxiliary air gap and the Hall sensing signal corresponding to the lower auxiliary air gap; and the displacement signal resolving circuit is configured to acquire the displacement of the rotor in the maglev rotor system according to the current and the result of the differential processing. The embodiment of the present disclose is suitable for detecting the position of the rotor in the permanent magnet offset maglev rotor system with the auxiliary air gap. Only the current value of the coil is needed. The detection by the Hall sensors and the control by the maglev rotor system are coplanar, all functions of a traditional position sensor and a traditional position self-sensing detection method are realized, and meanwhile, there are advantages that the axial size of the rotor is reduced, the detection and the control are coplanar, and high precision and simple design are realized, thus providing conditions for high-precision control by the maglev system.

It is to be understood that the foregoing general description and the following detailed description are exemplary and explanatory only, and cannot limit the present disclosure

BRIEF DESCRIPTION OF THE DRAWINGS

The drawings herein are incorporated into the specification and constitute a part of the specification, show the embodiments consistent with the present disclosure, and serve to explain the principles of the present disclosure together with the specification.

In order to illustrate the technical solutions in the embodiments of the present disclosure or the prior art more clearly, the drawings to be used in the description of the embodiments or the prior art will be briefly described below. Obviously, those of ordinary skills in the art can also obtain other drawings based on these drawings without going through any creative work.

DETAILED DESCRIPTION OF THE EMBODIMENTS

To make the objects, technical solutions, and advantages of the embodiments of the present disclosure clearer, the technical solutions in the embodiments of the present disclosure will be described clearly and completely below. Apparently, the described embodiments are merely some but not all of the embodiments of the present disclosure. Based on the embodiments of the present disclosure, all other embodiments obtained by those of ordinary skills in the art without going through any creative work shall fall within the scope of protection of the present disclosure.

Figure 1:
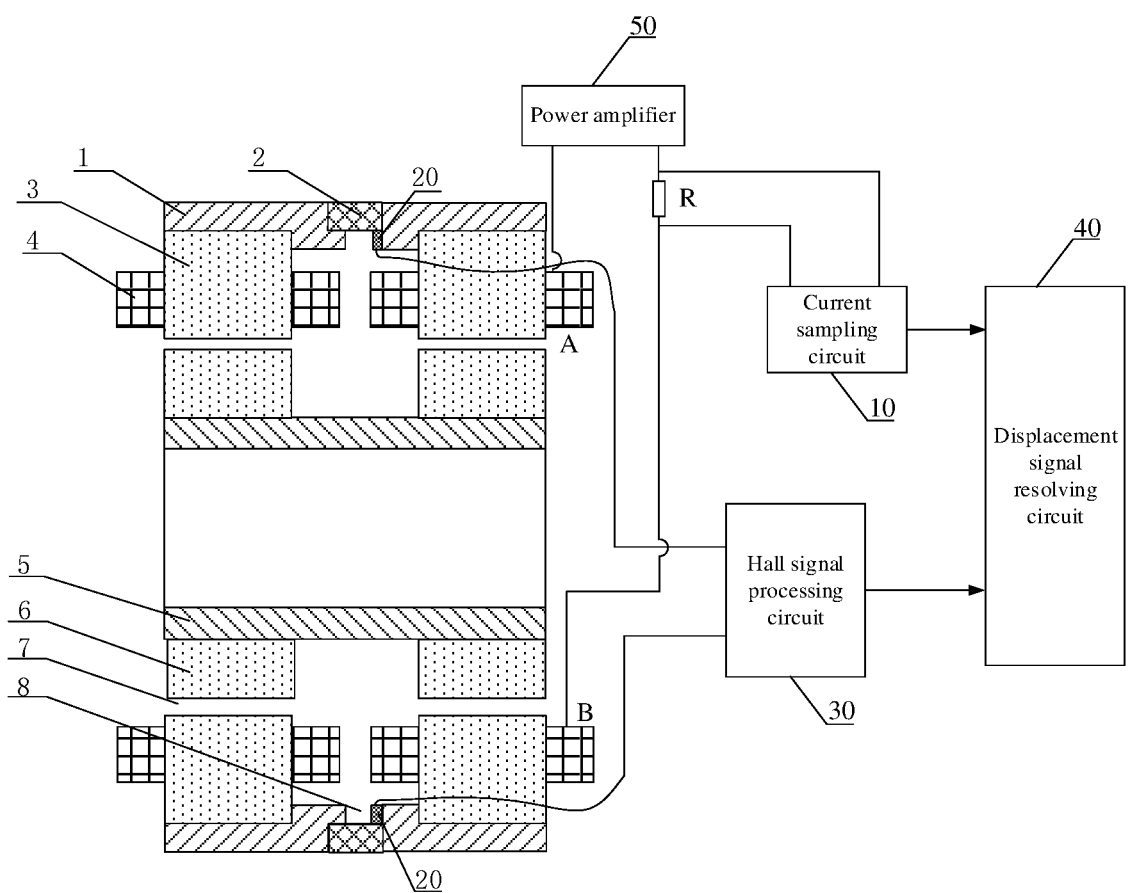
FIG. 1 is a schematic structural diagram of a displacement detection circuit of a maglev rotor system provided by an embodiment of the present disclosure.

FIG. 1 is a schematic structural diagram of a displacement detection circuit of a maglev rotor system provided by an embodiment of the present disclosure. As shown in FIG. 1, the displacement detection circuit of the maglev rotor system may include a current sampling circuit 10, Hall sensors 20, a Hall signal processing circuit 30, and a displacement signal resolving circuit 40. The Hall signal processing circuit 30 is connected to the Hall sensors 20. The displacement signal resolving circuit 40 is connected to the current sampling circuit 10 and the Hall signal processing circuit 30, respectively.

Figure 2:
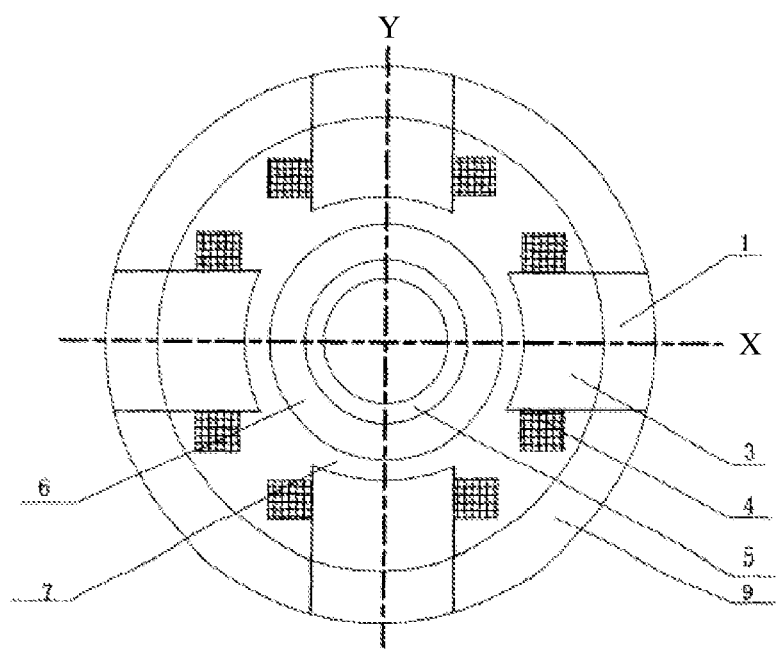
FIG. 2 is a schematic structural diagram of a top view of the maglev rotor system provided by the embodiment of the present disclosure along an axial direction.

FIG. 2 is a schematic structural diagram of a top view of the maglev rotor system provided by the embodiment of the present disclosure along an axial direction. Referring to FIGS. 1 and 2, the current sampling circuit 10 is configured to collect a current flowing through coils 4, wherein coils 4 include coils distributed in series in the maglev rotor system. The maglev rotor system may be a permanent-magnet offset maglev rotor system with an auxiliary air gap 8, and the maglev rotor system is a two-degree-of-freedom bearing, which may be configured to support in X and Y directions at the same time. FIG. 1 shows a cross-sectional view of the maglev rotor system along the axial direction. Taking the X direction as an example, among four coils 4 shown in FIG. 1 which are distributed in series in the same direction in the permanent-magnet offset maglev rotor system, two coils 4 distributed in an X+ direction are connected in series in the same direction, two coils 4 distributed in an X− direction are connected in series in the same direction, and the coils 4 of X+ and X− are connected in series in opposite directions. Currents flowing through the four coils 4 are equal, such that it is only necessary to sample the current flowing through one coil 4 in the same direction.

Specifically, with reference to FIGS. 1 and 2, the maglev rotor system includes two outer magnetic conducting bodies (namely stator magnetic conducting rings 1 and one permanent magnet 2), eight stator cores 3, eight exciting coils 4, one inner magnetic conducting ring (namely a rotator magnetic conducting body 5), two rotor cores 6 and eight outer magnetic isolating bodies 9. The eight stator cores 3 form stator magnetic poles in the X and Y directions at left and right ends of the maglev rotor system, wherein every four stator cores 3 form four stator magnetic poles in the X and Y directions at one end of the maglev rotor system. The eight outer magnetic isolating bodies 9 are connected to the stator cores 3 in the X and Y directions at the left and right ends of the maglev rotor system, each stator magnetic pole is wound with the exciting coil 4, and the outer magnetic conducting bodies 1 are arranged outside the stator cores 3. The permanent magnet 2 is located between the two outer magnetic conducting bodies 1 in the axial direction, an auxiliary air gap 8 is formed inside the permanent magnet 2 between the two outer magnetic conducting bodies 1 in the axial direction, and the auxiliary air gap 8 is configured to form an electrically excited flux path. The rotor cores 6 are arranged inside the stator cores 3, and a certain gap is left between inner surfaces of the stator cores 3 and outer surfaces of the rotor cores 6 to form an air gap 7, which is namely a primary air gap 7. The inner magnetic conducting ring 5 is mounted inside the rotor cores 6 and connects the rotor cores 6 at the left and right ends to form a flux path.

The Hall sensors 20 are arranged in an upper auxiliary air gap and a lower auxiliary air gap of the maglev rotor system. The sensing surfaces of the Hall sensors are perpendicular to magnetic field directions in the corresponding auxiliary air gaps 8. As illustrated in FIG. 1 and FIG. 2, the Hall sensors 20 may be miniature flexible probes with a thickness less than 0.5 mm. The sensing surfaces of the Hall sensors 20 are arranged perpendicular to the magnetic field directions in the corresponding auxiliary air gaps 8, such that the detection by the Hall sensors 20 and the control by the maglev rotor system are coplanar.

Figure 3:
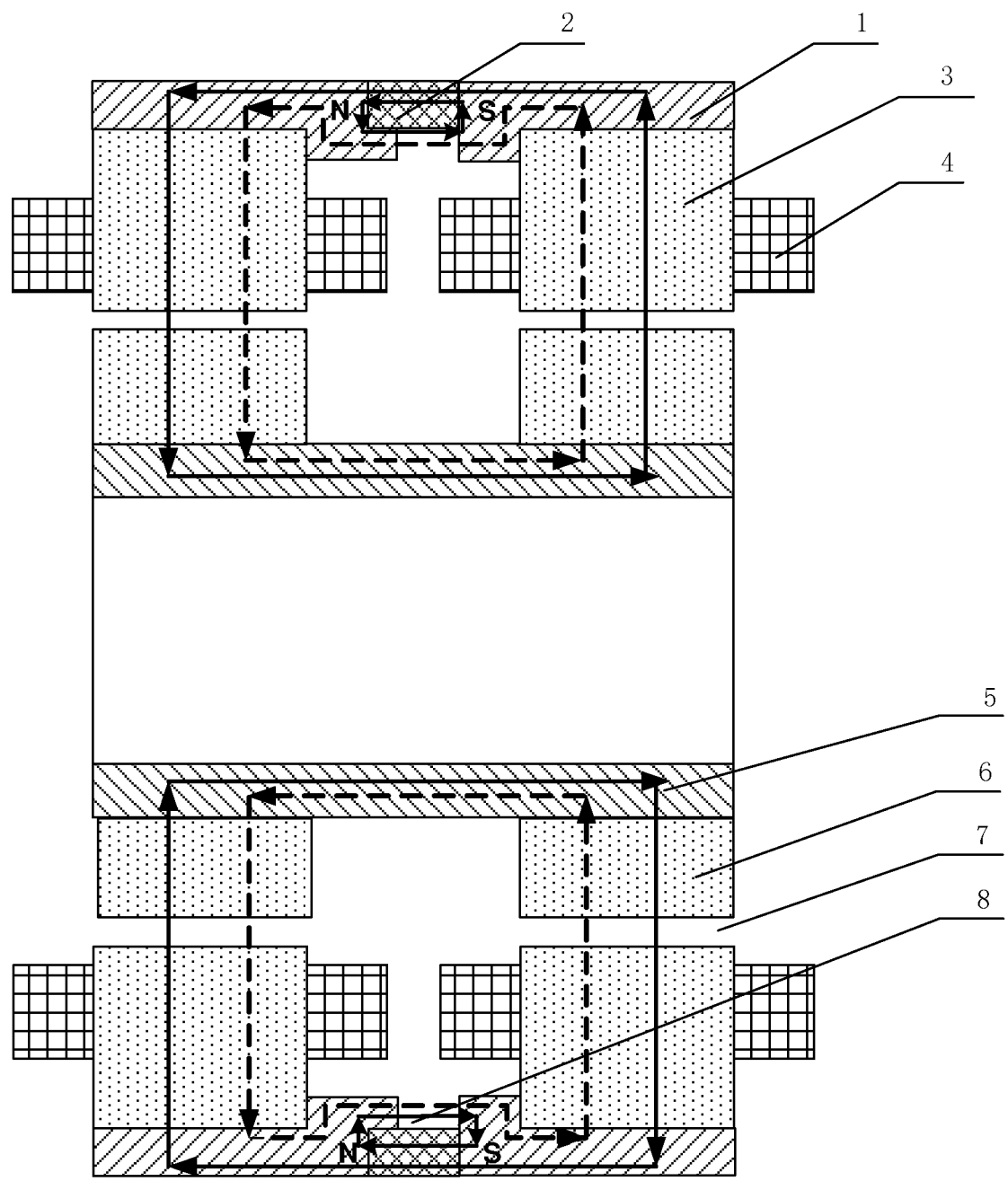
FIG. 3 is a schematic structural diagram of a cross section of the maglev rotor system provided by the embodiment of the present disclosure along the axial direction.

FIG. 3 is a schematic structural diagram of a cross section of the maglev rotor system provided by the embodiment of the present disclosure along the axial direction. Referring to FIGS. 1-3, the Hall signal processing circuit 30 is connected to the Hall sensors 20, and the Hall signal processing circuit 30 is configured to perform differential processing a Hall sensing signal corresponding to the upper auxiliary air gap and a Hall sensing signal corresponding to the lower auxiliary air gap. Specifically, referring to FIGS. 1-3, in the maglev rotor system, an electromagnetic path is a magnetic path shown by a dotted line in FIG. 3, and the electromagnetic path must pass through the auxiliary air gaps 8 in addition to passing through the primary air gap 7 to form a closed loop. A permanent magnetic path is a magnetic path shown by a solid line in FIG. 3. The permanent magnetic path is divided into two parts, wherein one part of the permanent magnetic path passes through the primary air gap 7 and the other part of the permanent magnetic path passes through the auxiliary air gap 8. Therefore, a magnetic field in the auxiliary air gap 8 is formed by superposing an electromagnetic field with a part of permanent magnetic field. Influenced by a control current and a length of the primary air gap, an electromagnetic flux in the auxiliary air gap 8 is a variable value, while a magnetic resistance of the auxiliary air gap 8 is constant, and a permanent magnetic flux in the auxiliary air gap 8 is a fixed value. In the embodiment of the present disclosure, the Hall signal processing circuit 30 is arranged to differentiate the Hall sensing signal corresponding to the upper auxiliary air gap from the Hall sensing signal corresponding to the lower auxiliary air gap, such that an influence of the permanent magnetic flux in the auxiliary air gap 8 may be counteracted to obtain a quantity only related to the electromagnetic flux.

The displacement signal resolving circuit 40 is connected to the current sampling circuit 10 and the Hall signal processing circuit 30, respectively. The displacement signal resolving circuit 40 is configured to acquire a displacement of a rotor in the maglev rotor system according to the current and a result of the differential processing, which means that the displacement signal resolving circuit 40 can directly obtain a width of the primary air gap corresponding to the displacement of the rotor to be acquired in the maglev rotor system according to the current flowing through the corresponding coil 4 collected by the current sampling circuit 10 and the result of the differential processing of the Hall sensing signal corresponding to the upper auxiliary air gap and the Hall sensing signal corresponding to the lower auxiliary air gap by the Hall signal processing circuit 30, thus acquiring a position of the rotor in the maglev rotor system. Therefore, all functions of a traditional position sensor and a traditional position self-sensing detection method are realized, and meanwhile, there are advantages that an axial size of the rotor is reduced, the detection and the control are coplanar, and high precision and simple design are realized, thus providing conditions for high-precision control by the maglev system.

Figure 4:
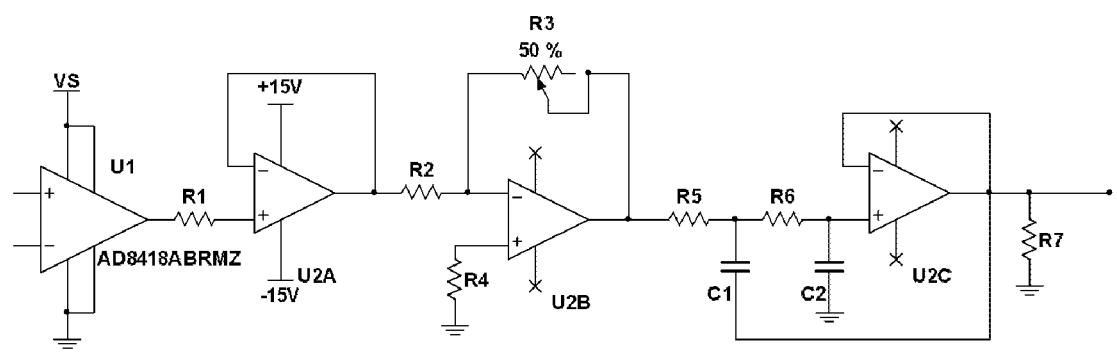
FIG. 4 is a schematic structural diagram of a current sampling circuit provided by the embodiment of the present disclosure.

FIG. 4 is a schematic structural diagram of the current sampling circuit provided by the embodiment of the present disclosure. Referring to FIGS. 1-4, the current sampling circuit 10 comprises a first amplifying circuit U2B, wherein the first amplifying circuit U2B is configured to amplify the current flowing through a sampling resistor.

Specifically, it is only necessary to sample the current flowing through one coil 4 in the same direction, which means that only one sampling resistor R is needed in the same direction. One end of the sampling resistor R may be connected to one external terminal A of the four coils 4, and the other end of the sampling resistor R may be connected to the other external terminals B of the four coils 4. Currents flowing through the four coils 4 may be obtained by collecting the current flowing through the sampling resistor R. Illustratively, the sampling resistor R may be connected in series with a power amplifier 50 to preliminarily amplify the current collected by the current sampling circuit 10, thus improving a current detection precision.

The first amplifying circuit U2B is configured to amplify the current flowing through the sampling resistor R, and the current sampling circuit 10 may calculate an output current of the corresponding coil 4 by detecting voltages at the positive and negative ends of the sampling resistor R. Illustratively, as shown in FIG. 4, the current sampling circuit 10 may further comprise a first voltage following circuit U2A and a first filter circuit U2C. A forward end + and a reverse end − of a current detection amplifier U1 are connected to two ends of the sampling resistor R, respectively. By detecting voltages at the positive and negative ends of the sampling resistor R, the current flowing through the output coil 4 is calculated. The current enters the first amplifying circuit U2B through the first voltage following circuit U2A, the first amplifying circuit U2B amplifies the current by a set number of times, and then the amplified current is filtered by the first filter circuit U2C and outputted. In this way, the current sampling circuit 10 has fewer stages, is easy to realize, and can effectively ensure the reliability of the system.

Optionally, referring to FIGS. 1-4, the width of the primary air gap corresponding to the displacement of the rotor to be acquired may be set to satisfy the following calculation formula:

$$h = \frac{1}{2A_2}\sqrt{(2A_2h_1 + A_1h_2)^2 - \frac{2\mu_0 NI(4A_2h_1 + 2A_1h_2)}{B_1 - B_2}},$$

wherein h is the width of the primary air gap corresponding to the displacement of the rotor to be acquired; the displacement of the rotor in the maglev rotor system is equal to a sum of the position of the stator in the maglev rotor system and the width of the primary air gap corresponding to the displacement of the rotor; $\mu_0$ is a permeability of vacuum; N is a number of turns of one of the coils; and I is the current flowing through the coil 4. When the rotor in the maglev rotor system is located in a balanced position, the primary air gap has a width of $h_1$ and a surface area of $A_1$. The auxiliary air gap has a width of $h_2$ which is a constant and a surface area of $A_2$. $B_1$ is the Hall sensing signal corresponding to the upper auxiliary air gap, and $B_2$ is the Hall sensing signal corresponding to the lower auxiliary air gap.

Specifically, the above formula may be derived as follows.

When the rotor in the maglev rotor system is located in the balanced position, the width of the primary air gap is set as $h_1$ and the surface area of the primary air gap is set as $A_1$. The width of the auxiliary air gap is set as $h_2$ and the surface area of the auxiliary air gap is set as $A_2$. The width of the primary air gap corresponding to the displacement of the rotor to be acquired is set as h.

According to the Ampere's circuital law:

$$\Phi \times (2R_1 + R_2) = 2NI,$$

wherein $\Phi$ is a magnetic flux; N is the number of turns of an electromagnetic coil in the maglev rotor system, namely, a number of turns of one of the coil. I is the current of the coil, namely, the current flowing through the sampling resistor. $R_1$ is a magnetic resistance corresponding to the primary air gap. $R_2$ is a magnetic resistance corresponding to the auxiliary air gap. $R_1$ satisfies the following calculation formula:

$$R_1 = \frac{h_1 + h}{\mu_0 A_1},$$

$R_2$ satisfies the following formula:

$$R_2 = \frac{h_2}{\mu_0 A_2}.$$

A magnetic induction intensity $B_{e1}$ generated by an electromagnetic flux in the upper auxiliary air gap is:

$$B_{e1} = \frac{\Phi}{A_2} = \frac{2\mu_0 NI}{2A_2(h_1 + h) + A_1 h_2}.$$

A magnetic induction intensity $B_{e2}$ generated by an electromagnetic flux in the lower auxiliary air gap is:

$$B_{e2} = \frac{\Phi}{A_2} = \frac{-2\mu_0 NI}{2A_2(h_1 - h) + A_1 h_2}.$$

A magnetic field in the auxiliary air gap is formed by superposing an electromagnetic field with a part of a permanent magnetic field, and considering an influence of a permanent magnetic flux BY, a magnetic induction intensity $B_1$ generated by a magnetic field in the upper auxiliary air gap satisfies the following calculation formula:

$$B_1 = B_{e1} + B_y = \frac{2\mu_0 NI}{2A_2(h_1 + h) + A_1 h_2} + B_y.$$

A magnetic induction intensity $B_2$ generated by a magnetic field in the lower auxiliary air gap satisfies the following formula:

$$B_2 = B_{e2} + B_y = \frac{-2\mu_0 NI}{2A_2(h_1 - h) + A_1 h_2} + B_y.$$

In order to eliminate a common-mode interference, the magnetic induction intensity $B_1$ generated by the magnetic field in the upper auxiliary air gap and the magnetic induction intensity $B_2$ generated by the magnetic field in the lower auxiliary air gap are differentiated to obtained that:

$$B_1 - B_2 = \frac{2\mu_0 NI}{2A_2(h_1 + h) + A_1 h_2} - \frac{-2\mu_0 NI}{2A_2(h_1 - h) + A_1 h_2} =$$

$$2\mu_0 NI * \frac{4A_2 h_1 + 2A_1 h_2}{(2A_2 h_1 + A_1 h_2)^2 - 4A_2^2 h^2}.$$

According to an inverse solution, the width h of the primary air gap corresponding to the displacement of the rotor to be acquired satisfies the following calculation formula:

$$h = \frac{1}{2A_2} \sqrt{(2A_2 h_1 + A_1 h_2)^2 - \frac{2\mu_0 NI(4A_2 h_1 + 2A_1 h_2)}{B_{upper} - B_{lower}}}.$$

The displacement of the rotor in the maglev rotor system is equal to a position of a stator in the maglev rotor system, which is namely a sum of a position of a bearing and the width h of the primary air gap corresponding to the displacement of the rotor, thus acquiring the displacement of the rotor in the maglev rotor system.

Optionally, an amplification factor of the first amplifying circuit U2B may be set based on the following formula:

$$a = 2\mu_0 N I (4A_2 h_1 + 2A_1 h_2),$$

wherein a is the amplification factor of the first amplifying circuit U2B; $\mu_0$ is the permeability of vacuum; and N is the number of turns of one of the coils. When the rotor in the maglev rotor system is located in a balanced position, the primary air gap has a width of $h_1$ and a surface area of $A_1$, and the auxiliary air gap has a width of $h_2$ and a surface area of $A_2$. The amplification factor a of the first amplifying circuit U2B is set to satisfy the above formula to obtain $2\mu_0 NI(4A_2 h_1 + 2A_1 h_2)$ in the calculation formula of h, and I is the current flowing through the sampling resistor.

Figure 5:
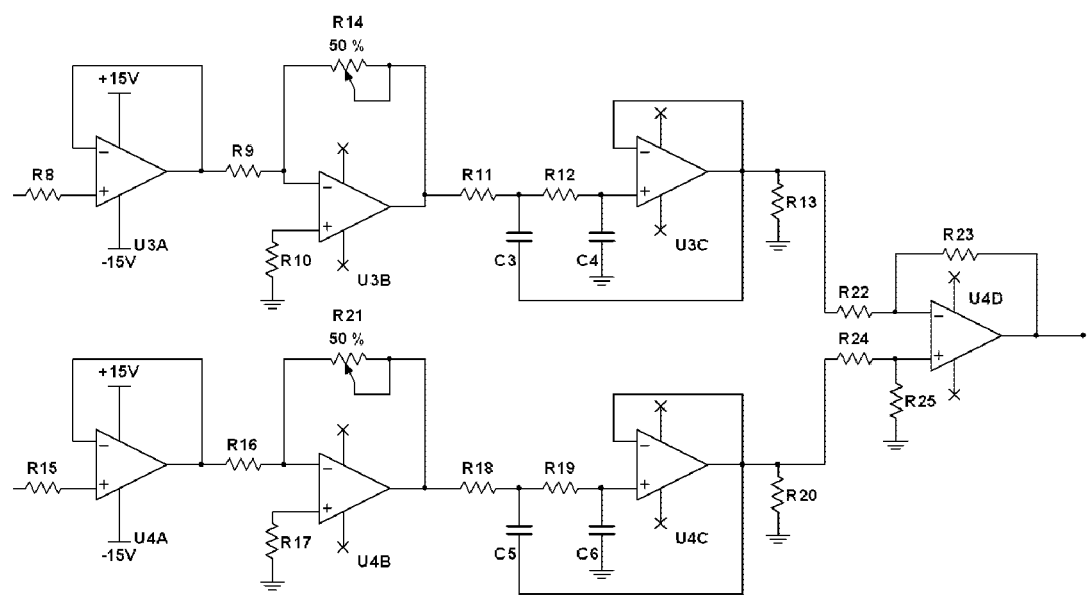
FIG. 5 is a schematic structural diagram of a Hall signal processing circuit provided by the embodiment of the present disclosure.

FIG. 5 is a schematic structural diagram of the Hall signal processing circuit provided by the embodiment of the present disclosure. With reference to FIG. 1 to FIG. 5, the Hall signal processing circuit 30 comprises two amplifying branches and a differential circuit U4D. One amplifying branch is a branch where R8 is located, the other amplifying branch is a branch where R15 is located, and the amplifying branches are connected to the corresponding Hall sensors 20. Each amplifying branch comprises a second amplifying circuit. The amplifying branch where R8 is located comprises a second amplifying circuit U3B, and the amplifying branch where R13 is located comprises a second amplification circuit U4B. The second amplifying circuits in the amplifying branches are connected to the corresponding Hall sensing signals of the corresponding auxiliary air gaps, and output ends of the second amplifying circuits in the two amplifying branches are both connected to the differential circuit U4D.

Specifically, one amplifying branch may be connected to the Hall sensor 20 corresponding to the upper auxiliary air gap, and the other amplifying branch may be connected to the Hall sensor 20 corresponding to the lower auxiliary air gap. For example, the amplifying branch comprising the resistor R8 may be connected to the Hall sensor 20 corresponding to the upper auxiliary air gap, and the amplifying branch comprising the resistor R15 may be connected to the Hall sensor 20 corresponding to the lower auxiliary air gap. The Hall sensors 20 transmit sensed signals of the corresponding auxiliary air gaps to the corresponding amplifying branches respectively, and the second amplifying circuits amplify corresponding currents by a set number of times and then output the amplified currents to the differential circuit U4D. Illustratively, a magnetic induction intensity B (a sum of an electromagnetic induction intensity and a permanent magnetic induction intensity) is detected based on a Hall effect. A Hall voltage U H=$K_H I_H B$ is obtained through the Hall sensors, wherein $K_H$ is a Hall sensitivity, which is related to a material property and a geometric dimension of a Hall sheet, and is a constant for a certain Hall probe; and $I_H$ is a supply current to the probe, which is unrelated to the current of the coil. Therefore, it is obtained that:

$$B = \frac{U_H}{K_H I_H},$$

wherein B is the magnetic induction intensity B of the corresponding air gap. Therefore, the amplification factor of the second amplifying circuit may be set as:

$$\frac{1}{K_H I_H},$$

wherein $I_H$ is the supply current to the probe in the corresponding auxiliary air gap.

Illustratively, as shown in FIG. 5, each amplifying branch may further comprise a second voltage following circuit and a second filter circuit. The amplifying branch where R8 is located comprises a second voltage following circuit U3A and a second filter circuit U3C, and the amplifying branch where R13 is located comprises a second voltage following circuit U4A and a second filter circuit U4C. The Hall sensors 20 detect and output the currents in the auxiliary air gaps 8, and the currents pass through the corresponding second voltage following circuits, second amplifiers and the second filter circuits and then are converted into magnetic induction intensities in the auxiliary air gaps 8. The two magnetic induction intensities pass through the differential circuit U4D and then are outputted, which means that the differential circuit U4D realizes subtraction of B1 and B2 for eliminating a common-mode interference caused by a part of permanent magnetic flux in the auxiliary air gaps 8 to obtain a magnetic induction intensity difference only related to the electromagnetic coil.

Optionally, the displacement signal resolving circuit 40 may comprise a division circuit and a square rooting circuit. The division circuit is connected to the square rooting circuit, the division circuit is configured to divide an output signal of the current sampling circuit 10 and an output signal of the Hall signal processing circuit 30, and the square rooting circuit is configured for performing offset adjustment and square rooting functions on an output signal of the division circuit.

Figure 6:
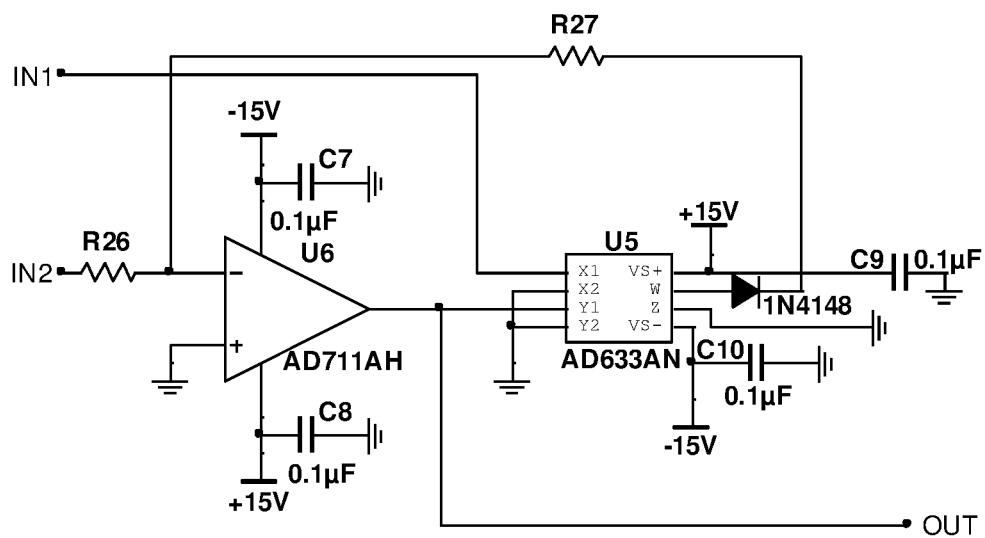
FIG. 6 is a schematic structural diagram of a division circuit provided by the embodiment of the present disclosure.

FIG. 6 is a schematic structural diagram of the division circuit provided by the embodiment of the present disclosure. Referring to FIGS. 1-6, the division circuit may comprise a main arithmetical unit U5. For example, U5 may be a chip of model AD633AN. The output signal of the current sampling circuit 10 is inputted from a terminal IN2, and the output signal of the Hall signal processing circuit 30 is inputted from a terminal IN1, which means that a right end of R7 is connected to the terminal IN2, and a right end of R23 is connected to the terminal IN1, such that a division result is obtained at a terminal OUT of the division circuit. The result is as follows:

$$-\frac{2\mu_0 NI(4A_2h_1 + 2A_1h_2)}{B_{upper} - B_{lower}}$$

This result is a negative number.

Figure 7:
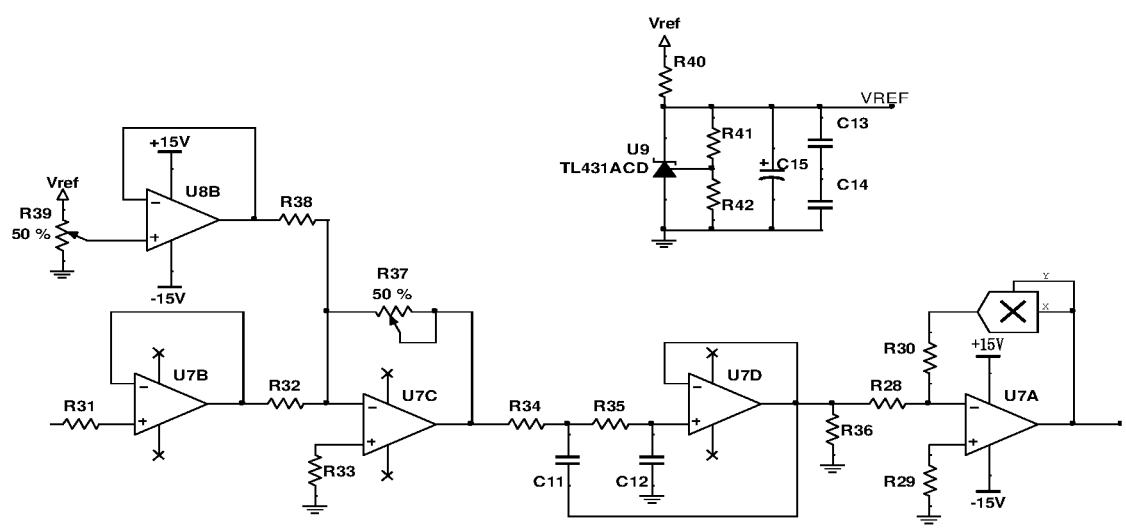
FIG. 7 is a schematic structural diagram of a square rooting circuit provided by the embodiment of the present disclosure.

FIG. 7 is a schematic structural diagram of the square rooting circuit provided by the embodiment of the present disclosure. With reference to FIG. 1 to FIG. 7, the square rooting circuit may comprise an offset adjustment circuit and a square-rooting circuit U7A. U8B and U7C form the offset adjustment circuit. The offset adjustment circuit is connected to the square-rooting circuit, the offset adjustment circuit is configured to superimpose an offset adjustment value on the output signal of the division circuit according to a reference signal Vref, and the square-rooting circuit is configured to perform square rooting functions on an output signal of the offset adjustment circuit.

Specifically, the square rooting circuit may further comprise a reference signal generating circuit, which is namely a circuit shown in the upper right of FIG. 7, and the reference voltage Vref is generated by TL431ACD and configured to perform offset adjustment. The square rooting circuit may further comprise a third voltage following circuit U7B and a third filter circuit U7D. The output signal of the division circuit is inputted from a left side of the resistor R31, after a calculation result of the division circuit passes through the third voltage following circuit U7B, the offset adjustment circuit, which is namely an offset modulator, superimposes a fixed value on the signal and then the signal is inversely outputted. The signal passes through the third filter circuit U7D and then is transmitted to the square-rooting circuit U7A, such as a negative voltage square-rooting processing circuit, for calculation, thus obtaining the width h of the primary air gap corresponding to the displacement of the rotor to be acquired.

Optionally, the offset adjustment value corresponding to the offset adjustment circuit satisfies the following calculation formula:

$$b=(2A_2h_1+A_1h_2)^2,$$

wherein b is the offset adjustment value corresponding to the offset adjustment circuit, and when the rotor in the maglev rotor system is located in a balanced position, the primary air gap has a width of $h_1$ and a surface area of $A_1$, and the auxiliary air gap has a width of $h_2$ and a surface area of $A_2$. With reference to the formula of h above, the calculation result of the division circuit is as follows:

$$-\frac{2\mu_0 NI(4A_2h_1 + 2A_1h_2)}{B_{upper} - B_{lower}}.$$

$(2A_2h_1+A_1h_2)^2$ is superimposed on the calculation result and then the calculation result is inversely outputted. The calculation result passes through the third filter circuit U7D and then is calculated by the negative voltage square-rooting processing circuit, thus obtaining the width h of the primary air gap corresponding to the displacement of the rotor to be acquired.

Optionally, referring to FIGS. 1-7, amplification factor control resistors in the current sampling circuit 10 and the Hall signal processing circuit 30, an amplification control resistor in the offset adjustment circuit and a reference signal introduction resistor are all sliding rheostats. The amplification factor control resistor in the current sampling circuit 10 is R3, the amplification factor control resistors in the Hall signal processing circuit 30 are R14 and R21, the amplification factor control resistor in the offset adjustment circuit is R37, and the reference signal introduction resistor in the offset adjustment circuit is R39, which means that R3, R14, R21, R39, and R37 may all be the sliding rheostats, such that the amplification factor satisfied by the amplifying circuit is reached by adjusting the amplification factor control resistor, and the offset adjustment value of the offset adjustment circuit is reached by adjusting the reference signal introduction resistor. Use of the sliding rheostats not only facilitates debugging, but also facilitates transplantation on different devices without modification, thus meeting a requirement of multiple sets of devices.

In the embodiment of the present disclosure, the current of the coil in the sampling resistor may be obtained by the current sampling circuit 10 and is amplified and filtered. The Hall sensors 20 are placed in the auxiliary air gaps of the permanent-magnet offset maglev rotor system, and the sensing surfaces are perpendicular to the magnetic field directions. In this structure, a variable electromagnetic flux and a part of permanent magnetic flux pass through the auxiliary air gaps, and the part of permanent magnetic flux is a fixed value. The Hall sensors 20 sense the magnetic fields in the air gaps to obtain Hall voltages. After amplification and filtration by the Hall signal processing circuit 30, a magnetic induction intensity of a unilateral air gap is obtained, and then magnetic induction intensities of bilateral air gaps are differentiated to eliminate the common-mode interference caused by the permanent magnetic flux in the auxiliary air gaps. The displacement signal resolving circuit 40 composed of a divider and an open circuit divides a filtered magnetic bearing coil current signal and a differentiated magnetic bearing air gap magnetic induction intensity first, and then a square-rooting operation is performed after offset adjustment to obtain a displacement signal. All functions of a traditional position sensor and a traditional position self-sensing detection method are realized, and meanwhile, there are advantages that the axial size of the rotor is reduced, the detection and the control are coplanar, and high precision and simple design are realized, thus providing conditions for high-precision control by the maglev system.

The embodiment of the present disclosure further provides a maglev rotor displacement self-sensing system. As shown in FIG. 1, the maglev rotor displacement self-sensing system comprises a maglev rotor system and the displacement detection circuit of the maglev rotor system in the embodiment above. The maglev rotor system is connected to the displacement detection circuit, and the maglev rotor system comprises a permanent magnet offset maglev rotor system with an auxiliary air gap. The maglev rotor displacement self-sensing system has the beneficial effects of the embodiment above, which will not be repeated herein.

It should be noted that relational terms herein such as "first" and "second" and the like, are used merely to distinguish one entity or operation from another entity or operation, and do not necessarily require or imply there is any such relationship or order between these entities or operations. Furthermore, the terms "including", "comprising" or any variations thereof are intended to embrace a non-exclusive inclusion, such that a process, a method, an article, or a device including a series of elements, includes not only those elements but also includes other elements not expressly listed, or also includes elements inherent to such process, method, article, or device. In the absence of further limitation, an element defined by the phrase "including a . . . " does not exclude the presence of the same element in the process, method, article, or device.

The above are only specific embodiments of the present disclosure, so that those skilled in the art can understand or realize the present disclosure. Many modifications to these embodiments will be obvious to those skilled in the art, and the general principles defined herein can be implemented in other embodiments without departing from the spirit or scope of the present disclosure. Therefore, the present disclosure will not to be limited to these embodiments shown herein but is to be in conformity with the widest scope consistent with the principles and novel features disclosed herein.

INDUSTRIAL APPLICABILITY

The present disclosure is suitable for detecting the position of the rotor in the permanent magnet offset maglev rotor system with the auxiliary air gap, only the current value of the coil is needed, and the detection by the Hall sensors and the control by the maglev rotor system are coplanar. All functions of a traditional position sensor and a traditional position self-sensing detection method are realized, and meanwhile, there are advantages that the axial size of the rotor is reduced, the detection and the control are coplanar, and high precision and simple design are realized, thus providing conditions for high-precision control by the maglev system, with a very strong industrial practicability.

The invention claimed is:

1. A displacement detection circuit of a maglev rotor system, comprising:
a current sampling circuit configured to collect a current flowing through corresponding coils, wherein the coils comprise coils distributed in series in the maglev rotor system;
Hall sensors, wherein the Hall sensors are arranged in an upper auxiliary air gap and a lower auxiliary air gap of the maglev rotor system, and wherein sensing surfaces of the Hall sensors are perpendicular to magnetic field directions in the corresponding auxiliary air gaps;
a Hall signal processing circuit connected to the Hall sensors and configured to perform differential processing on a Hall sensing signal corresponding to the upper auxiliary air gap and a Hall sensing signal corresponding to the lower auxiliary air gap; and
a displacement signal resolving circuit connected to the current sampling circuit and the Hall signal processing circuit, respectively, wherein the displacement signal resolving circuit is configured to acquire a displacement of a rotor in the maglev rotor system based on the current and a result of the differential processing.

2. The displacement detection circuit according to claim 1, wherein the current sampling circuit comprises:
a first amplifying circuit, wherein the first amplifying circuit is configured to amplify the current flowing through a sampling resistor.

3. The displacement detection circuit according to claim 2, wherein an amplification factor of the first amplifying circuit satisfies the following formula:

$a=2\mu_0 N(4A_2 h_1 + 2A_1 h_2)$, wherein a is the amplification factor of the first amplifying circuit, wherein to is a permeability of vacuum, wherein N is a number of turns of one of the coils, and when the rotor in the maglev rotor system is located in a balanced position, a primary air gap has a width of $h_1$ and a surface area of $A_1$, and the auxiliary air gap has a width of $h_2$ and a surface area of $A_2$.

4. The displacement detection circuit according to claim 1, wherein the Hall signal processing circuit comprises:
two amplifying branches and a differential circuit, wherein the amplifying branches are connected to the corresponding Hall sensors; and
each of the amplifying branches comprises a second amplifying circuit, wherein the second amplifying circuits in the amplifying branches are connected to the corresponding Hall sensing signals of the corresponding auxiliary air gaps, and wherein output ends of the second amplifying circuits in the two amplifying branches are both connected to the differential circuit.

5. The displacement detection circuit according to claim 1, wherein the displacement signal resolving circuit comprises:
a division circuit and a square rooting circuit, wherein the division circuit is connected to the square rooting circuit, wherein the division circuit is configured to divide an output signal of the current sampling circuit and an output signal of the Hall signal processing circuit, and wherein the square rooting circuit is configured to perform offset adjustment and square rooting functions on an output signal of the division circuit.

6. The displacement detection circuit according to claim 5, wherein the square rooting circuit comprises:
an offset adjustment circuit and a square-rooting circuit, wherein the offset adjustment circuit is connected to the square-rooting circuit, wherein the offset adjustment circuit is configured to superimpose an offset adjustment value on the output signal of the division circuit according to a reference signal, and wherein the square-rooting circuit is configured to perform square root functions on an output signal of the offset adjustment circuit.

7. The displacement detection circuit according to claim 6, wherein the offset adjustment value corresponding to the offset adjustment circuit satisfies the following formula:

$b=(2A_2 h_1 + A_1 h_2)^2$, wherein b is the offset adjustment value corresponding to the offset adjustment circuit, and when the rotor in the maglev rotor system is located in a balanced position, a primary air gap has a width of $h_1$ and a surface area of $A_1$, and the auxiliary air gap has a width of $h_2$ and a surface area of $A_2$.

8. The displacement detection circuit according to claim 6, wherein amplification factor control resistors in the current sampling circuit and the Hall signal processing circuit, an amplification factor control resistor in the offset adjustment circuit, and an introduction resistor of the reference signal are all sliding rheostats.

9. The displacement detection circuit according to claim 1, wherein a width of a primary air gap corresponding to the displacement of the rotor satisfies the following formula:

$$h = \frac{1}{2A_2}\sqrt{(2A_2 h_1 + A_1 h_2)^2 - \frac{2\mu_0 NI(4A_2 h_1 + 2A_1 h_2)}{B_1 - B_2}}.$$

wherein h is the width of the primary air gap corresponding to the displacement of the rotor, wherein the displacement of the rotor in the maglev rotor system is equal to a sum of a position of the stator in the maglev rotor system and the width of the primary air gap corresponding to the displacement of the rotor, wherein to is a permeability of vacuum, wherein N is a number of turns of one of the coils, and wherein $\mu_0$ is the current, and when the rotor in the maglev rotor system is located in a balanced position, the primary air gap has a width of $h_1$ and a surface area of $A_1$, the auxiliary air gap has a width of $h_2$ and a surface area of $A_2$, wherein $B_1$ is the Hall sensing signal corresponding to the upper auxiliary air gap, and wherein $B_2$ is the Hall sensing signal corresponding to the lower auxiliary air gap.

10. A maglev rotor displacement self-sensing system, comprising a maglev rotor system and a displacement detection circuit, wherein the displacement detection circuit comprises:

a current sampling circuit configured to collect a current flowing through corresponding coils, wherein the coils comprise coils distributed in series in the maglev rotor system;

Hall sensors, wherein the Hall sensors are arranged in an upper auxiliary air gap and a lower auxiliary air gap of the maglev rotor system, and wherein sensing surfaces of the Hall sensors are perpendicular to magnetic field directions in the corresponding auxiliary air gaps;

a Hall signal processing circuit connected to the Hall sensors and configured to perform differential processing on a Hall sensing signal corresponding to the upper auxiliary air gap and a Hall sensing signal corresponding to the lower auxiliary air gap; and a displacement signal resolving circuit connected to the current sampling circuit and the Hall signal processing circuit, respectively, wherein the displacement signal resolving circuit is configured to acquire a displacement of a rotor in the maglev rotor system based on the current and a result of the differential processing, wherein the maglev rotor system is connected to the displacement detection circuit, and the maglev rotor system comprises a permanent magnet offset maglev rotor system with an auxiliary air gap.

* * * * *